United States Patent
Yugami

(10) Patent No.: US 8,552,507 B2
(45) Date of Patent: Oct. 8, 2013

(54) SEMICONDUCTOR DEVICE AND METHOD OF MANUFACTURING THE SAME

(75) Inventor: Jiro Yugami, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/515,500

(22) PCT Filed: Dec. 24, 2009

(86) PCT No.: PCT/JP2009/071492
§ 371 (c)(1),
(2), (4) Date: Jun. 12, 2012

(87) PCT Pub. No.: WO2011/077536
PCT Pub. Date: Jun. 30, 2011

(65) Prior Publication Data
US 2012/0248545 A1     Oct. 4, 2012

(51) Int. Cl.
*H01L 21/70* (2006.01)

(52) U.S. Cl.
USPC .......... 257/369; 257/411; 257/E27.062; 257/E21.632; 257/E21.639; 438/216

(58) Field of Classification Search
USPC .......... 257/369, 411, E27.062, E21.632, 257/E21.639; 438/216
See application file for complete search history.

(56) References Cited

U.S. PATENT DOCUMENTS 6,780,776 B1    8/2004  Qi et al.
7,564,108 B2 *  7/2009  Wang et al. .................. 257/410
2008/0128822 A1  6/2008  Koyama et al.
2008/0283928 A1  11/2008 Sato et al.
2008/0283929 A1  11/2008 Nabatame
2009/0263950 A1  10/2009 Koyama et al.

FOREIGN PATENT DOCUMENTS

| JP | 2005-514765 A | 5/2005 |
| JP | 2007-088122 A | 4/2007 |
| JP | 2007-329237 A | 12/2007 |
| JP | 2008-211182 A | 9/2008 |
| JP | 2008-288226 A | 11/2008 |

(Continued)

OTHER PUBLICATIONS

V. Narayanan et al., "Band-Edge High Performance High-κ/ Metal Gate n-MOSFETs using Cap Layers Containing Group IIA and IIIB Elements with Gate-First Processing for 45 nm and Beyond", Symposium on VLSI Technology, pp. 224-225, 2006.
P. Sivasubramani et al., "Dipole Moment Model Explaining nFET $V_t$ Tuning Utilizing La, Sc, Er, and Sr Doped HfSiON Dielectrics", Symposium on VLSI Technology, p. 68-69, 2007.

(Continued)

*Primary Examiner* — Tu-Tu Ho
(74) *Attorney, Agent, or Firm* — Miles & Stockbridge P.C.

(57) ABSTRACT

A p-type MIS transistor Qp arranged in a pMIS region Rp of a silicon substrate 1 includes a pMIS gate electrode GEp formed so as to interpose a pMIS gate insulating film GIp formed of a first insulating film z1 and a first high-dielectric film hk1, and an n-type MIS transistor Qn arranged in an nMIS region Rn includes an nMIS gate electrode GEn formed so as to interpose an nMIS gate insulating film GIn formed of a first insulating film z1 and a second high-dielectric film hk2. The first high-dielectric film hk1 is formed of an insulating film mainly made of hafnium and oxygen with containing aluminum, titanium, or tantalum. Also, the second high-dielectric film hk2 is formed of an insulating film mainly made of hafnium, silicon, and oxygen with containing an element of any of group Ia, group IIa, and group IIIa.

24 Claims, 11 Drawing Sheets

(56) References Cited

FOREIGN PATENT DOCUMENTS

| | | |
|---|---|---|
| JP | 2008-288465 A | 11/2008 |
| JP | 2008-306051 A | 12/2008 |
| JP | 2009-099747 A | 5/2009 |
| JP | 2009-111380 A | 5/2009 |
| JP | 2009-194068 A | 8/2009 |
| JP | 2009-252895 A | 10/2009 |
| JP | 2009-253003 A | 10/2009 |
| JP | 2009-283770 A | 12/2009 |

OTHER PUBLICATIONS

Hyung-Suk Jung et al., "A Highly Manufacturable MIPS (Metal Inserted Poly Si Stack) Technology with Novel Threshold Voltage Control", Symposium on VLSI Technology, p. 232-233, 2005.

Kazuhiko Yamamoto, "Electrical and physical properties of $HfO_2$ films prepared by remote plasma oxidation of Hf metal", Applied Physics Letters, vol. 83 (11), pp. 2229-2231, 2003.

* cited by examiner

SEMICONDUCTOR DEVICE AND METHOD OF MANUFACTURING THE SAME

TECHNICAL FIELD

The present invention relates to a semiconductor device and a method of manufacturing the same, and, more particularly, the present invention relates to a technique effectively applied to a semiconductor device including field-effect transistors each formed of a gate electrode which is formed of a metal film and a gate insulating film which is formed of a high-dielectric film.

BACKGROUND ART

A semiconductor device is equipped with an integrated circuit including a CMIS (Complementary Metal Oxide Semiconductor) circuit configuration as a basic structure. In a p-channel-type MIS-type field-effect transistor (also referred to as "FET") (hereinafter, simply referred to as "p-type MIS transistor") and an n-channel-type MIS-type field-effect transistor (hereinafter, simply referred to as "n-type MIS transistor") which configure this CMIS circuit, a silicon oxide film is used as a material of a gate insulating film, and a polycrystalline silicon film is used as a material of a gate electrode.

For example, Japanese Patent Application Laid-Open No. 2008-288226 (Patent Document 1) discloses a technique of using a hafnium (Hf)-based oxide as oxide having a higher relative permittivity than that of silicon oxide so as to be applied to a gate insulating film of a MOS transistor. Moreover, for example, Japanese Patent Application Laid-Open No. 2008-288465 (Patent Document 2) discloses a technique of forming a gate insulating film so as to contain at least any one of Hf, aluminum (Al), and yttrium (Y). Moreover, for example, Japanese Patent Application Laid-Open No. 2007-329237 (Patent Document 3) discloses a technique in a p-channel transistor of forming a gate insulating film which is made of hafnium-based (HfSiON) High-k so as to contain aluminum atoms. Moreover, for example, Japanese Patent Application Laid-Open No. 2007-88122 (Patent Document 4) discloses a technique of using a High-k gate insulating film with a structure containing Hf or Y.

For example, Symposium on VLSI Technology, p. 224, 2006, (Non-Patent Document 1) describes a technique of shifting a threshold voltage of an n-channel-type MOSFET toward a negative direction by forming a cap layer containing lanthanum (La) and magnesium (Mg) whose thicknesses are 1 to 20 Å on a hafnium oxide film, which is described by V. Narayanan et al. Moreover, for example, Symposium on VLSI Technology, p. 68, 2007 (Non-Patent Document 2) describes a technique of shifting the threshold voltage of the n-channel-type MOSFET toward the negative direction by forming a cap layer containing La and/or strontium (Sr) or a metal cap layer containing scandium (Sc), erbium (Er), or their alloy on a HfSiON film, which is described by P. Sivasubramani et al. Moreover, for example, Symposium on VLSI Technology, p. 232, 2005 (Non-Patent Document 3) describes a technique capable of increasing a film thickness of an alumina film and decreasing a threshold voltage by forming the alumina film on a HfSiO film in order to control a threshold voltage of a p-channel-type MISFET, which is described by H-S. Jung et al. Moreover, for example, Japanese Patent Application No. 2005-514765 (Patent Document 5) discloses a technique of forming a HfSiO/interface layer structure by forming metal Hf on a silicon oxide film, and then, diffusing Hf by a thermal treatment. Moreover, for example, Applied Physics Letter, Vol. 83 (11), p. 2229, 2003 (Non-Patent Document 4) discloses a technique of forming hafnium oxide by performing plasma oxidation to metal Hf.

PRIOR ART DOCUMENTS

Patent Documents

Patent Document 1: Japanese Patent Application Laid-Open Publication No. 2008-288226
Patent Document 2: Japanese Patent Application Laid-Open Publication No. 2008-288465
Patent Document 3: Japanese Patent Application Laid-Open Publication No. 2007-329237
Patent Document 4: Japanese Patent Application Laid-Open Publication No. 2007-88122
Patent Document 5: Japanese Patent Application No. 2005-514765

Non-Patent Documents

Non-Patent Document 1: Symposium on VLSI Technology, p. 224, 2006
Non-Patent Document 2: Symposium on VLSI Technology, p. 68, 2007
Non-Patent Document 3: Symposium on VLSI Technology, p. 232, 2005
Non-Patent Document 4: Applied Physics of Letter, vol. 83 (11), p. 2229, 2005

DISCLOSURE OF THE INVENTION

Problems to be Solved by the Invention

In recent years, along with miniaturization of a MIS transistor configuring a semiconductor device, reduction in a thickness of a gate insulating film formed of a silicon oxide film has been rapidly advanced. On the other hand, along with the advance of the reduction in the thickness of the gate insulating film, a phenomenon that the gate insulating film is apparently thick because an inside of a gate electrode in a vicinity of an interface of the gate insulating film is depleted by a gate voltage has been significant. As a result, it has been difficult to ensure an ON-current, and therefore, reduction in an operation speed of the MIS transistor has been significant.

Moreover, as the reduction in the film thickness of the gate insulating film, carriers can pass through the gate insulating film by direct tunneling, and a leakage current is increased. Further, in the p-type MIS transistor, impurity boron in the gate electrode diffuses into a substrate through the gate insulating film to vary an impurity concentration of a channel region, resulting in varying the threshold voltage.

The above-described problems have arisen along with the miniaturization of the MIS transistor due to the reduction in the film thickness of the gate insulating film.

Accordingly, there is a technique of replacing the material of the gate insulating film by an insulating material having a higher relative permittivity (also referred to as a high-dielectric material or a high-k material) than that of silicon oxide and replacing the material of the gate electrode from polycrystalline silicon to a metal material.

In the case that the gate insulating film is formed of the high-dielectric film and even if its capacity is the same as that converted in the thickness of the silicon oxide film, its actual physical film thickness can be increased by the "(relative permittivity of the high-dielectric film)/(relative permittivity of the silicon oxide film)" times the thickness, and as a result, a leakage current can be reduced. Various metal oxides such as hafnium oxide and zirconium oxides have been studied as the high-dielectric film.

Also, in the case that the gate electrode is formed of a metal material which is not polycrystalline silicon, the above-described problems such as the ON-current reduction due to the influence of depletion and leakage of boron from the gate electrode to the substrate can be avoided.

Incidentally, design for low power consumption is important for a CMIS circuit. For the design, it is required to decrease each threshold voltage of bipolar n-channel type and p-channel type MIS transistors. Therefore, in the MIS structure formed of the metal gate electrode/ high-dielectric gate insulating film as described above, it is required to select a gate electrode material having a work function suitable for each of the n-type and the p-type.

From this point of view, the present inventor has studied a MIS transistor including a gate insulating film with a cap-insulating-film structure as explained below. For example, in the case that a high-permittivity gate insulating film containing hafnium is used, when a film containing lanthanum or yttrium is arranged on an upper layer thereof, it is known that the threshold voltage of the n-type MIS transistor can be decreased. Also, in the case that the high-permittivity gate insulating film containing hafnium is used, when a film containing aluminum is arranged on an upper layer thereof, it is known that the threshold voltage of the p-type MIS transistor can be decreased. Such a film arranged on the gate insulating film in order to vary the threshold voltage will be hereinafter referred to as a cap film.

However, from various reports and further studies made by the present inventor in the past, the following facts have been found out. In a case that a cap layer (for example, $Y_2O_3$) for the n-type MIS transistor is used, when silicon (Si) is contained in the hafnium-based insulating film serving as a base, the threshold voltage can be largely decreased. Meanwhile, a degree of the decrease in the threshold voltage is small in an $HfO_2$ film not containing Si or an Hf ON film obtained by nitridation of $HfO_2$. On the other hand, in a case that a cap layer (for example, $Al_2O_3$) for the p-type MIS transistor is used, when silicon is contained in the hafnium-based insulating film serving as the base, the degree of decrease in the threshold voltage is small. When silicon is not contained therein, the threshold voltage can be largely decreased. Therefore, both of when silicon is contained in the hafnium-based insulating film serving as the base and when silicon is not contained therein, there is a problem that either one of the threshold voltages of the n-type MIS transistor and the p-type MIS transistor cannot be sufficiently decreased. That is, it has been found out that, by the technique studied by the present inventor, it is difficult to achieve high performance of both of the n-channel type and the p-channel type of the MIS transistors with the structure of the metal gate electrode/ high-dielectric gate insulating film.

Accordingly, a preferred aim of the present invention is to provide a technique of achieving high performance of a semiconductor device including MIS transistors with a structure of a metal gate electrode/high-dielectric gate insulating film.

The above and other preferred aims and novel characteristics of the present invention will be apparent from the description of the present specification and the accompanying drawings.

Means for Solving the Problems

A summary of one example of a plurality of inventions disclosed in the present application will be briefly described as follows.

A semiconductor device includes: a p-channel-type field-effect transistor in a first region of a semiconductor substrate; and an n-channel-type field-effect transistor in a second region of the semiconductor substrate, the p-channel-type field-effect transistor includes a first gate electrode formed on the semiconductor substrate so as to interpose a first gate insulating film formed thereon, the first gate insulating film includes a first insulating film and a first high-dielectric film sequentially formed on the semiconductor substrate, the first high-dielectric film is formed of an insulating film mainly made of hafnium and oxygen with containing aluminum, titanium, or tantalum, the n-channel-type field-effect transistor includes a second gate electrode formed on the semiconductor substrate so as to interpose a second gate insulating film formed thereon, the second gate insulating film includes the first insulating film and a second high-dielectric film sequentially formed on the semiconductor substrate, and the second high-dielectric film is formed of an insulating film mainly made of hafnium, silicon, and oxygen with containing an element of any of group Ia, group IIa, and group IIIa.

EFFECTS OF THE INVENTION

The effects obtained by the above-described example of the plurality of inventions disclosed in the present application will be representatively briefly described below.

That is, high performance of a semiconductor device including MIS transistors with a structure of a metal gate electrode/high-dielectric gate insulating film can be achieved.

BRIEF DESCRIPTIONS OF THE DRAWINGS

Figure 19:
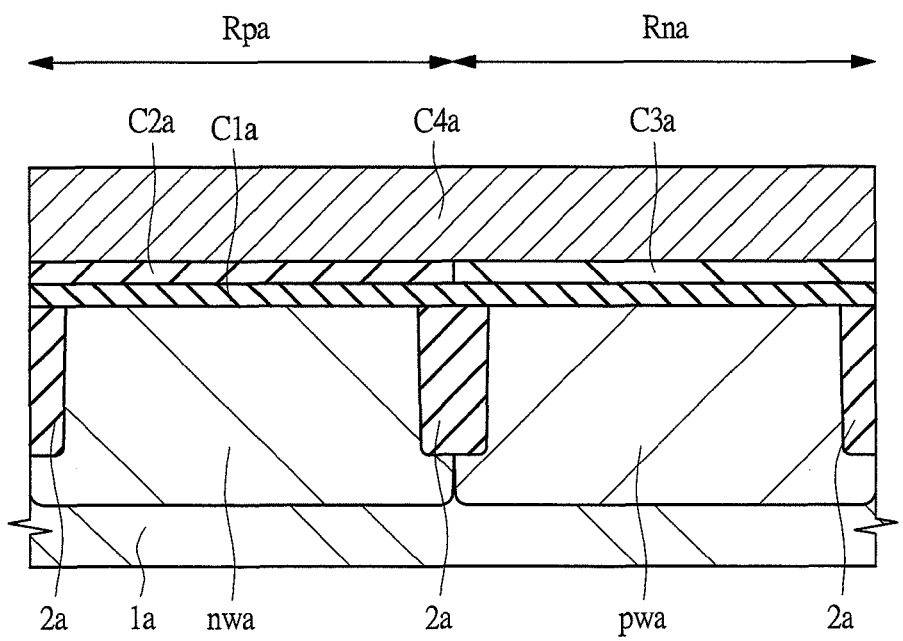
FIG. 19 is a cross-sectional view of a principal part in a manufacturing step of the semiconductor device studied by the present inventor.
Figure 20:
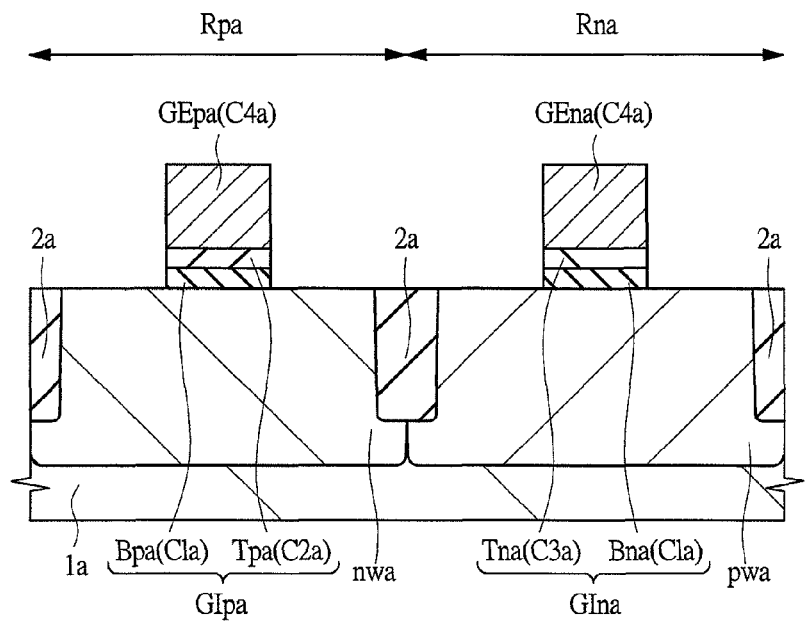
Figure 21A:
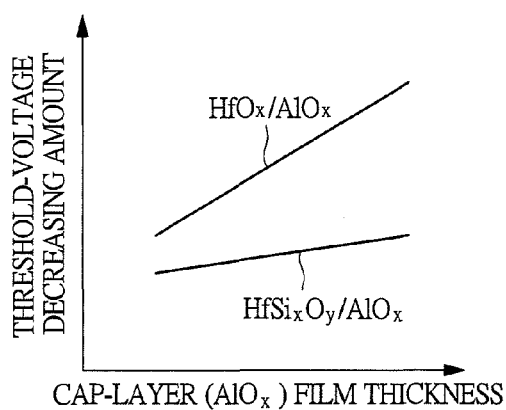
Figure 21B:
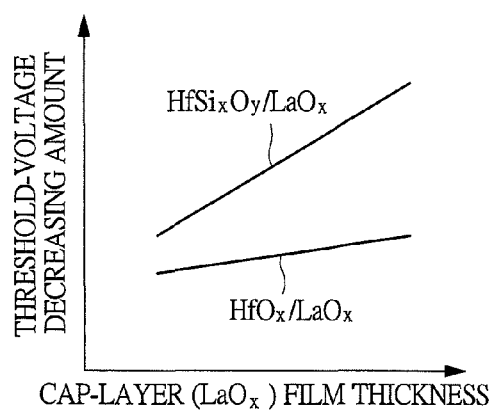

FIG. 20 is a cross-sectional view of a principal part in the manufacturing step of the semiconductor device, continued from FIG. 19; and FIGS. 21A and 21B are graphic diagrams illustrating characteristics of the semiconductor device studied by the present inventor, FIG. 21A is a graphic diagram illustrating characteristics of a structure in which aluminum oxide is used for a cap layer, and FIG. 21B is a graphic diagram illustrating characteristics of a structure in which lanthanum oxide is used for the cap layer.

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable. Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above. Also, components having the same function are denoted by the same reference symbols throughout the all drawings for describing the embodiments, and the repetitive description thereof is omitted as much as possible.

Hereinafter, the embodiments of the present invention will be explained in detail based on the drawings.

Figure 18:
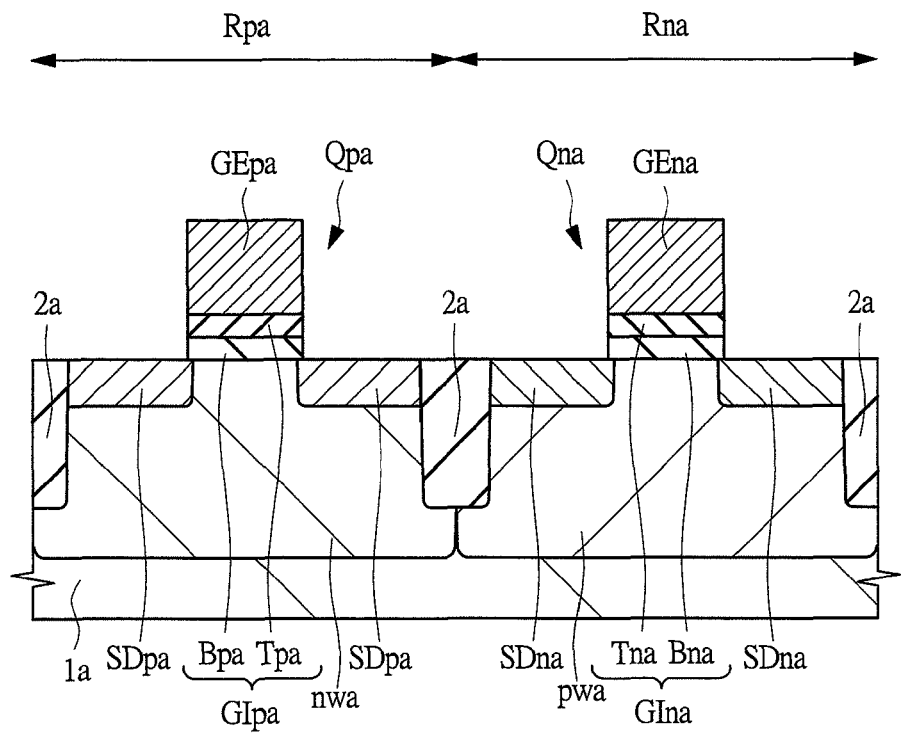
FIG. 18 is a cross-sectional view of a principal part for explaining a structure of a semiconductor device studied by the present inventor.

First, MIS transistors with a structure of a metal gate electrode/high-dielectric gate insulating film included in a semiconductor device studied by the present inventor will be explained in detail. FIG. 18 is a cross-sectional view of a principal part for explaining the structure of the semiconductor device studied by the present inventor. A silicon substrate 1a is defined so that a pMIS region Rpa and an nMIS region Rna do not electrically interfere with each other by an isolation portion 2a made of silicon oxide with a STI (Shallow Trench Isolation) structure. An n-well nwa is formed in a surface of the silicon substrate 1a in the pMIS region Rpa, and a p-well pwa is formed in a surface of the silicon substrate 1a in the nMIS region Rna. In the n-well nwa of the pMIS region Rpa, a p-type MIS transistor Qpa including: a pMIS gate insulating film GIpa; a pMIS gate electrode GEpa; and a pMIS n-type source/drain region SDpa is arranged. Also, in the p-well pwa of the nMIS region Rna, an n-type MIS transistor Qna including: an nMIS gate insulating film Gina; an nMIS gate electrode GEna; and nMIS p-type source/drain region SDna is arranged.

A high-dielectric material having a relative permittivity higher than that of silicon oxide ($SiO_x$) is applied to the pMIS gate insulating film GIpa and the nMIS gate insulating film GIna. More specifically, the pMIS gate insulating film GIpa is formed of double-layer high-dielectric insulating film in whose lower layer a pMIS main gate insulating film Bpa made of hafnium oxide ($HfO_x$) is arranged and in whose upper layer a pMIS cap insulating film Tpa made of aluminum oxide ($AlO_x$), titanium oxide ($TiO_x$), or tantalum oxide ($TaO_x$) is arranged. Also, the nMIS gate insulating film GIna is formed of a double-layer high-dielectric insulating film in whose lower layer an nMIS main gate insulating film Bna made of hafnium oxide is arranged and in whose upper layer an nMIS cap insulating film Tna made of lanthanum oxide ($LaO_x$) or yttrium oxide ($YO_x$) is arranged. Further, a metal material is applied to both of the gate electrodes GEna and GEpa. For example, the gate electrodes GEpa and GEna each made of titanium nitride (TiN) are applied.

A method of forming the MIS transistors Qpa and Qna with the structure studied by the present inventor as described above will be explained with reference to FIGS. 19 and 20.

As illustrated in FIG. 19, a hafnium oxide film C1a is formed on the silicon substrate 1a in which the isolation portion 2a, the n-well nwa, and the p-well pwa are formed. Subsequently, an aluminum oxide film C2a is formed in the pMIS region Rpa of the hafnium oxide film C1a, and a lanthanum oxide film C3a is formed in the nMIS region Rna thereof. They are separately formed by using photolithography, etching, and others. Then, a titanium nitride film C4a is formed on the aluminum oxide film C2a and the lanthanum oxide film C3a.

Next, as illustrated in FIG. 20, a titanium nitride film C4a, an aluminum oxide film C2a, and a hafnium oxide film C1a in the pMIS region Rpa, and a titanium nitride film C4a, a lanthanum oxide film C3a, and a hafnium oxide film C1a in the nMIS region Rna are processed to form a gate structure. For this process, photolithography and etching methods are used. In this manner, in the pMIS region Rpa, the pMIS gate electrode GEpa, which is formed of the titanium nitride film C4a, and the pMIS gate insulating film GIpa, which is formed of the aluminum oxide film C2a serving as the pMIS cap insulating film Tpa and the hafnium oxide film C1a serving as the pMIS main gate insulating film Bpa, are formed. Also, at the same time, in the nMIS region Rna, the nMIS gate electrode GEna, which is formed of the titanium nitride film C4a, and the nMIS gate insulating film GIna, which is formed of the lanthanum oxide film C3a serving as the nMIS cap insulating film Tna and the hafnium oxide film C1a serving as the nMIS main gate insulating film Bna, are formed.

Then, the source/drain regions SDp, SDn, or others as illustrated in FIG. 18 are formed (not illustrated) by photolithography and ion implantation methods or others.

As described above, in the MIS transistors with the structure of the metal gate electrode/high-dielectric gate insulating film, the structure to which the cap insulating films Tpa and Tna capable of decreasing the threshold voltages in both of p and n polarities are applied can be formed.

However, problems as described below have been found out by further studies made by the present inventor.

FIG. 21A illustrates a graph diagram for explaining a magnitude difference in the decrease of the threshold voltage depending on a difference in the material of the pMIS main gate insulating film Bpa in the p-type MIS transistor Qpa. A vertical axis represents a change amount of the threshold voltage, and a horizontal axis represents a film thickness of the pMIS cap insulating film Tpa made of aluminum oxide. Note that a symbol of each member corresponds to that of FIG. 18. In the p-type MIS transistor Qpa, steeper slope of the decrease in the threshold voltage can be achieved in the case of using the insulating film mainly made of hafnium oxide as the pMIS main gate insulating film Bpa than in the case of using the insulating film mainly made of hafnium silicate ($HfSi_xO_y$).

FIG. 21B illustrates a graph diagram for explaining a magnitude difference in the decrease in the threshold voltage depending on a difference in the material of the nMIS main gate insulating film Bna in the n-type MIS transistor Qna. A vertical axis represents a change amount of the threshold voltage, and a horizontal axis represents a film thickness of the nMIS cap insulating film Tna made of lanthanum oxide. Note that a symbol of each member corresponds to that of FIG. 18. In the n-type MIS transistor Qna, steeper slope of the decrease in the threshold voltage can be achieved in the case of using the insulating film mainly made of hafnium silicate as the nMIS main gate insulating film Bna than in the case of using the insulating film mainly made of hafnium oxide.

As described above, it has been clarified by the further study made by the present inventor that it is required to change the material for the p-channel type and the n-channel type also in the main gate insulating films Bpa and Bna in the lower layer in the gate insulating film in order to more effectively decrease the threshold voltage by using the cap structure. For example, while a method of separately forming them by photolithography and etching methods is also conceivable, the method is not desired since a factor limited by a processing accuracy is increased by miniaturization of the transistors. Also, since the number of manufacturing steps is increased, the method is not desired also from this point of view. As described above, in the semiconductor device including the MIS transistors with the structure of the metal gate electrode/high-dielectric gate insulating film studied by the present inventor, it has been found out that it is difficult to sufficiently decrease the threshold voltage in the MIS transistors of both polarities without separately forming the gate insulating films.

Figure 1:
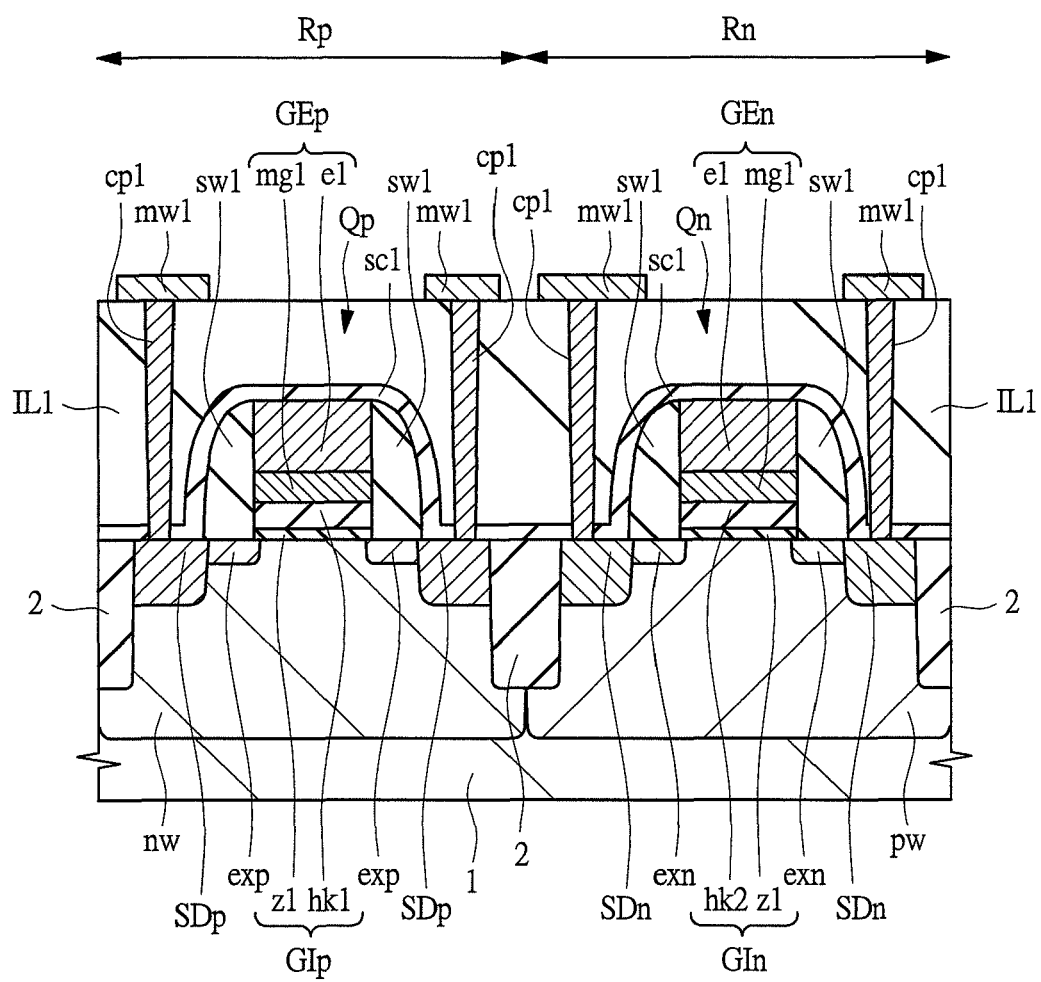
FIG. 1 is a cross-sectional view of a principal part of a semiconductor device according to an embodiment of the present invention.

Hereinafter, a semiconductor device of the present embodiment capable of solving the above-described problems will be explained in detail. FIG. 1 is a cross-sectional view of a principal part of a MIS transistor with a structure of a metal gate electrode/high-dielectric gate insulating film included in a semiconductor device of the present embodiment. FIG. 1 illustrates a p-type MIS transistor (p-channel type field-effect transistor) Qp arranged in a pMIS region (first region) Rp of a silicon substrate (semiconductor substrate) 1 and an n-type MIS transistor (n-channel type field-effect transistor) Qn arranged in an nMIS region (second region) Rn thereof. That is, the semiconductor device of the present embodiment includes the p-type MIS transistor Qp in the pMIS region Rp of the silicon substrate 1 and the n-type MIS transistor Qn in the nMIS region Rn of the same silicon substrate 1. Further, the p-type MIS transistor Qp and the n-type MIS transistor Qn have a dual gate structure in which the transistors are arranged close to each other so as to interpose an isolation portion (element isolation portion) 2 with the STI structure. Hereinafter, each structure of the transistors Qp and Qn will be explained with reference to FIG. 1.

The p-type MIS transistor Qp included in the semiconductor device of the present embodiment has components which are arranged in the pMIS region Rp and which are explained below.

An n-well nw which is an n-type semiconductor region is formed in a surface of the silicon substrate 1. The p-type MIS transistor Qp is formed in this n-well nw.

On the silicon substrate 1 in the n-well nw, a p-MIS gate electrode (first gate electrode) GEp formed so as to interpose a pMIS gate insulating film (first gate insulating film) GIp thereon is arranged.

Here, the pMIS gate insulating film GIp includes a first interface film (first insulating film) z1 and a first high-dielectric film hk1 which are sequentially formed on the silicon substrate 1. Both of the films have insulation properties. For example, the first interface film z1 is an insulating film mainly made of silicon oxide ($SiO_x$) or silicon oxynitride ($SiO_xN_y$). Also, here, a high-dielectric (high-k) film is a film having a relative permittivity higher than that of silicon oxide ($SiO_x$). For example, the first high-dielectric film hk1 is an insulating film of hafnium oxide ($HfO_x$) mainly made of hafnium (Hf) and oxygen (O) with containing aluminum (Al), titanium (Ti), or tantalum (Ta). Alternatively, for example, the first high-dielectric film hk1 may be an insulating film of hafnium oxynitride ($HfO_xN_y$) mainly mad of hafnium, oxygen, and nitrogen (N) with containing aluminum, titanium, or tantalum.

Also, the pMIS gate electrode GEp is a stacked film formed of a metal gate film (conductive film, second metal film) mg1 and a first conductive film (conductive film) e1 which are sequentially formed on the pMIS gate insulating film GIp. For example, the metal gate film mg1 is a conductive film, which is mainly made of titanium nitride (TiN) and has a resistivity as low as that of metal, and the first conductive film e1 is a conductive film, which is mainly made of polycrystalline silicon (also referred to as polysilicon, poly-Si).

A pMIS extension region exp which is a p-type semiconductor region is formed in a surface of the n-well nw on a lateral bottom portion of the pMIS gate electrode GEp. A pMIS source/drain region SDp which is a p-type semiconductor region is formed outer than the pMIS extension region exp in the n-well nw so as to be electrically connected to the pMIS extension region exp. An impurity concentration of the pMIS extension region exp is lower than that of the pMIS source/drain region SDp, and a junction depth of the pMIS extension region exp viewed from the surface of the silicon substrate 1 is shallower than that of the pMIS source/drain region SDp.

The sidewalls of the pMIS gate electrode GEp and the pMIS gate insulating film GIp are covered with a sidewall spacer sw1 formed of an insulating film mainly made of a silicon oxide film, a silicon nitride film, or others so as to be insulated from other members.

The p-type MIS transistor of the present embodiment includes the components as described above. More particularly, as described above, the p-type MIS transistor of the present embodiment has the MIS structure such that the metal gate electrode is formed on the silicon substrate 1 so as to interpose the high-dielectric gate insulating film.

The n-type MIS transistor Qn included in the semiconductor device of the present embodiment includes components arranged in the nMIS region Rn as explained below.

A p-well pw which is a p-type semiconductor region is formed in a surface of the silicon substrate 1. The n-type MIS transistor Qn is formed in this p-well pw.

On the silicon substrate 1 in the p-well pw, an n-MIS gate electrode (second gate electrode) GEn formed so as to interpose an nMIS gate insulating film (second gate insulating film) GIn thereon is arranged.

Here, the nMIS gate insulating film GIn includes the first interface film z1 and a second high-dielectric film hk2 which are sequentially formed on the silicon substrate 1. Both of the films have insulation properties. The first interface film z1 is made of the same material as that of the above-described first interface film z1 formed in the pMIS region Rp. Also, for example, the second high-dielectric film hk2 is an insulating film of hafnium silicate ($HfSi_xO_y$) mainly made of hafnium, silicon (Si), and oxygen with containing an element of any of group Ia, group IIa, and group IIIa. Alternatively, for example, the second high-dielectric film hk2 may be an insulating film of hafnium silicate nitride ($HfSi_xO_yN_z$) mainly made of hafnium, silicon, oxygen, and nitrogen with containing an element of any of group Ia, group IIa, and group IIIa. To the present embodiment, an insulating film containing, for example, yttrium (Y) or lanthanum (La) of the group IIIa is applied.

Also, the nMIS gate electrode GEn is a stacked film formed of a metal gate film mg1 and a first conductive film e1 which are sequentially formed on the nMIS gate insulating film GIn. These configurations are the same as those of the metal gate film mg1 and the first conductive film e1 formed in the pMIS region Rp as described above.

An nMIS extension region exn which is an n-type semiconductor region is formed in a surface of the p-well pw on a lateral bottom portion of the nMIS gate electrode GEn. An nMIS source/drain region SDn which is an n-type semiconductor region is formed outer than the nMIS extension region exn in the p-well pw so as to be electrically connected to the nMIS extension region exn. Here, an impurity concentration of the nMIS extension region exn is lower than that of the nMIS source/drain region SDn, and a junction depth of the nMIS extension region exn viewed from the surface of the silicon substrate 1 is shallower than that of the nMIS source/drain region SDn.

The sidewalls of the nMIS gate electrode GEn and the nMIS gate insulating film GIn are covered with a sidewall spacer sw1 formed of an insulating film mainly made of a silicon oxide film, a silicon nitride film, or others so as to be insulated from other members.

The n-type MIS transistor of the present embodiment includes the components as described above. More particularly, as described above, the n-type MIS transistor of the present embodiment has the MIS structure such that the metal gate electrode is formed on the silicon substrate 1 so as to interpose the high-dielectric gate insulating film.

Further, an interlayer insulating film IL1 is formed so as to interpose an etching stop film sc1 to cover both of the MIS transistors Qp and Qn. For example, the etching stop film sc1 is formed of an insulating film mainly made of silicon nitride, and the interlayer insulating film IL1 is formed of an insulating film mainly made of silicon oxide. And, a contact plug cp1, which reaches each of the source/drain regions SDp and SDn, each of the gate electrodes GEp and GEn, and others, is formed so as to penetrate through the interlayer insulating film IL1 and the etching stop film sc1. The contact plug cp1 is formed of a conductive film mainly made of, for example, tungsten (W). Also, a metal wiring mw1 to be connected to the contact plug cp1 is formed on the interlayer insulating film IL1. The metal wiring mw1 is formed of a conductive film mainly made of, for example, aluminum or copper (Cu).

The structure of the semiconductor device of the present embodiment has been described above.

More particularly, in the semiconductor device of the present embodiment, the following configuration is different between the p-type MIS transistor Qp and the n-type MIS transistor Qn. That is, while the first high-dielectric film hk1 configuring the pMIS gate insulating film GIp is the insulating film mainly made of hafnium oxide with containing aluminum, titanium, or tantalum in the p-type MIS transistor Qp, the second high-dielectric film hk2 configuring the nMIS gate insulating film GIn is the insulating film mainly made of hafnium silicate with containing yttrium or lanthanum in the n-type MIS transistor Qn. Such a structure in the semiconductor device of the present embodiment leads to effects as described below.

As explained with reference to FIGS. 21A and 21B, the method capable of effectively decreasing the threshold voltage in the p-type MIS transistor is to combine the high-dielectric gate insulating film made of hafnium oxide with aluminum, titanium, or tantalum. Also, the method capable of effectively decreasing the threshold voltage in the n-type MIS transistor is to combine the high-dielectric gate insulating film made of hafnium silicate with yttrium or lanthanum. The semiconductor device of the present embodiment has a configuration that is equivalent to the effective combinations as described above in the high-dielectric films hk1 and hk2 configuring the gate insulating films GIp and GIn included in the MIS transistors Qp and Qn of the respective polarities. That is, the first high-dielectric film hk1 of the p-type MIS transistor Qp is formed of the hafnium oxide film containing aluminum, titanium, or tantalum, and the second high-dielectric film hk2 of the n-type MIS transistor Qn is formed of hafnium silicate containing yttrium or lanthanum. By such a configuration, the threshold voltages can be effectively decreased. As a result, the high performance of the semiconductor device including the MIS transistors with the structure of the metal gate electrode/high-dielectric gate insulating film can be achieved.

The semiconductor device of the present embodiment has a structure in which a film thickness of the first interface film z1 of the n-type MIS transistor Qn is smaller than a film thickness of the first interface film z1 of the p-type MIS transistor Qp. A reason for this is due to manufacturing steps of the present embodiment explained below and will be explained later in detail.

Hereinafter, with reference to FIGS. 2 to 17, a method of manufacturing the semiconductor device of the present embodiment will be explained. FIGS. 2 to 17 illustrate each cross-sectional view of a principal part in the manufacturing steps at the same portion as that of FIG. 1. The method of manufacturing the semiconductor device of the present embodiment includes a step of forming the p-type MIS transistor Qp in the pMIS region Rp on the silicon substrate 1 and forming the n-type MIS transistor Qn in the nMIS region Rn. Hereinafter, these steps will be explained in detail.

Figure 2:
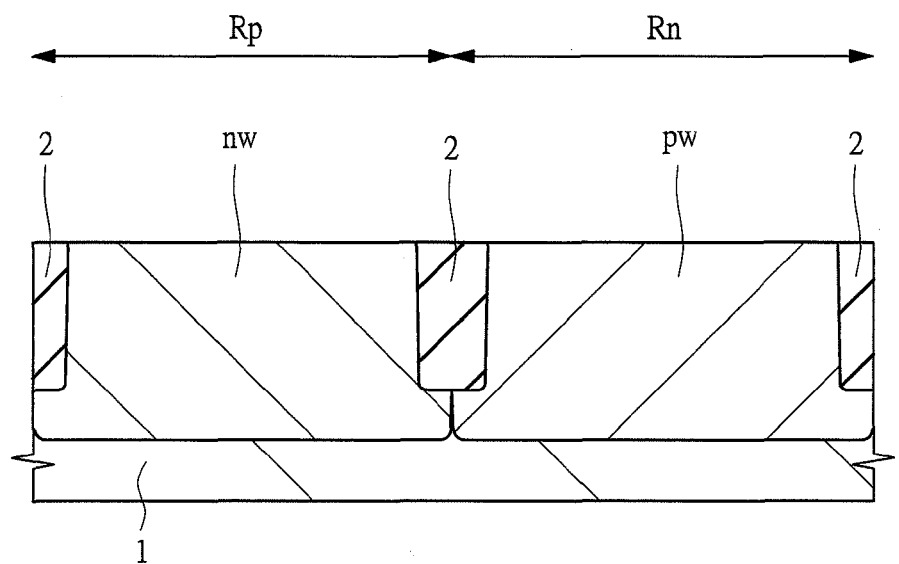
FIG. 2 is a cross-sectional view of a principal part in a manufacturing step of the semiconductor device, continued from FIG. 2.

First, as illustrated in FIG. 2, a silicon substrate 1 made of monocrystalline silicon is prepared. The silicon substrate 1 contains, for example, a p-type impurity such as boron (B). Also, in the steps explained below, the silicon substrate 1 is of a thin plate, whose shape is planar substantially circular, referred to as semiconductor wafer.

Then, the isolation portion 2 is formed in the surface of the silicon substrate 1. In order to form this, first, a shallow trench is formed by a photolithography method and a dry etching method or others. Subsequently, a silicon oxide film is formed so as to fill the trench. Then, the silicon oxide film that is not in the trench portion is removed by an etching method, a chemical mechanical polishing (Chemical and Mechanical Polishing: CMP) method, or others, so that the isolation portion 2 is formed. An active region is isolated by this isolation portion 2 to define a pMIS region Rp and an nMIS region Rn.

Subsequently, by using a photolithography method and an ion implantation method, an n-well nw is formed in the pMIS region Rp, and a p-well pw is formed in the nMIS region Rn. An n-type impurity such as phosphorus (P) or arsenic (As) is implanted into the n-well nw, and a p-type impurity such as boron is implanted into the p-well pw.

Figure 3:
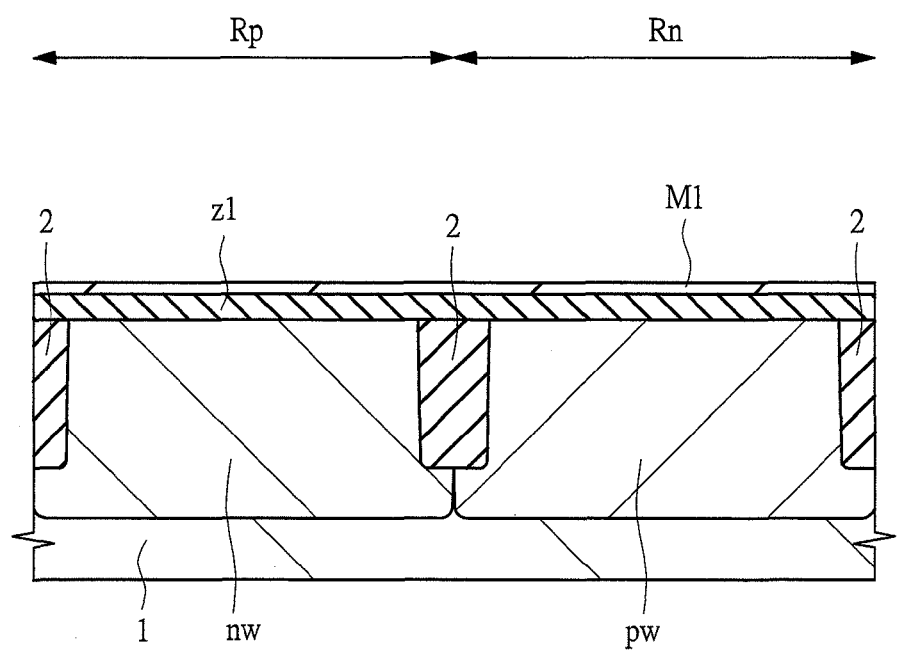
FIG. 3 is a cross-sectional view of a principal part in the manufacturing step of the semiconductor device, continued from FIG. 2.

Next, as illustrated in FIG. 3, a first interface film z1 is formed on the silicon substrate 1. Here, an insulating film mainly made of silicon oxide is formed by oxidizing the silicon substrate 1 in a state in which at least the substrate surfaces of the pMIS region Rp and the nMIS region Rn are exposed, and this film becomes the first interface film z1. For example, it is set that a film thickness of the first interface film z1 is about 1.5 nm. Also, as the first interface film z1, an insulating film mainly made of silicon oxynitride may be formed. In this case, the silicon oxynitride film is formed by, for example, a high-temperature short-time oxidation method using $N_2O$, $O_2$, and $H_2$.

Subsequently, a first metal film M1 is formed on the first interface film z1. Here, hafnium is deposited on the first interface film z1 by using a physical vapor deposition (PVD) method such as a sputtering method, and this becomes a first metal film M1. Alternatively, hafnium nitride ($HfN_x$) mainly made of hafnium and nitrogen may be similarly deposited on the first interface film z1 to become the first metal film M1. Here, it is set that a film thickness of the first metal film M1 is about 1 nm.

Figure 4:
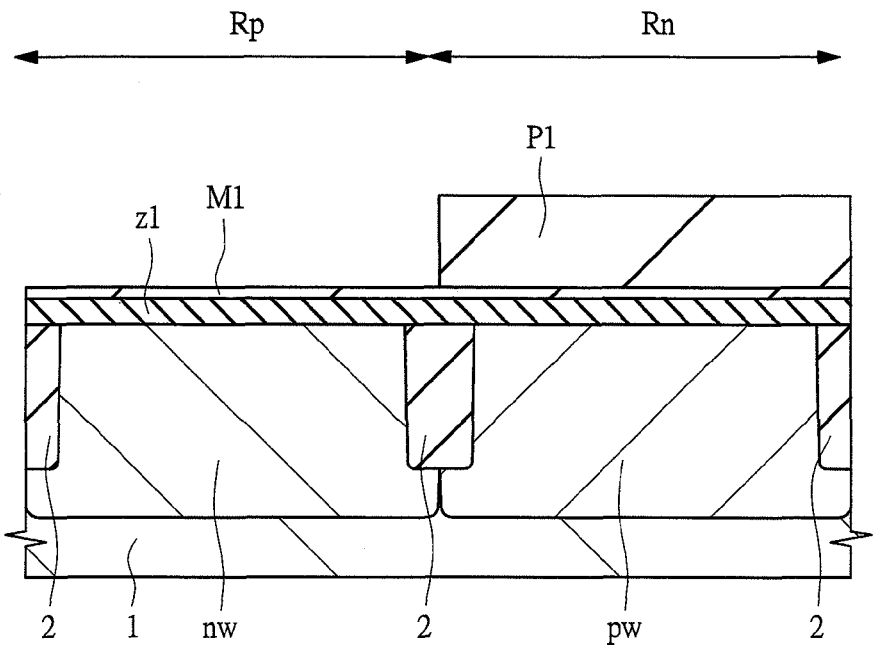
FIG. 4 is a cross-sectional view of a principal part in the manufacturing step of the semiconductor device, continued from FIG. 3.

Next, as illustrated in FIG. 4, a first protective film P1 is formed so as to cover the first metal film M1 of the nMIS region Rn. Here, first, the first protective film P1 made of polycrystalline silicon, non-crystalline silicon (also referred to as amorphous silicon), or silicon nitride is formed so as to cover a whole surface of the first metal film M1 by using, for example, a PVD method or a chemical vapor deposition (CVD) method. For example, it is set that a film thickness of the first metal film M1 is about 10 nm. Then, the first protective film P1 is patterned by a photolithography method and an etching method so as to cover the nMIS region Rn and expose the pMIS region Rp. Here, the first protective film P1 is etched by using, for example, ammonia water.

Figure 5:
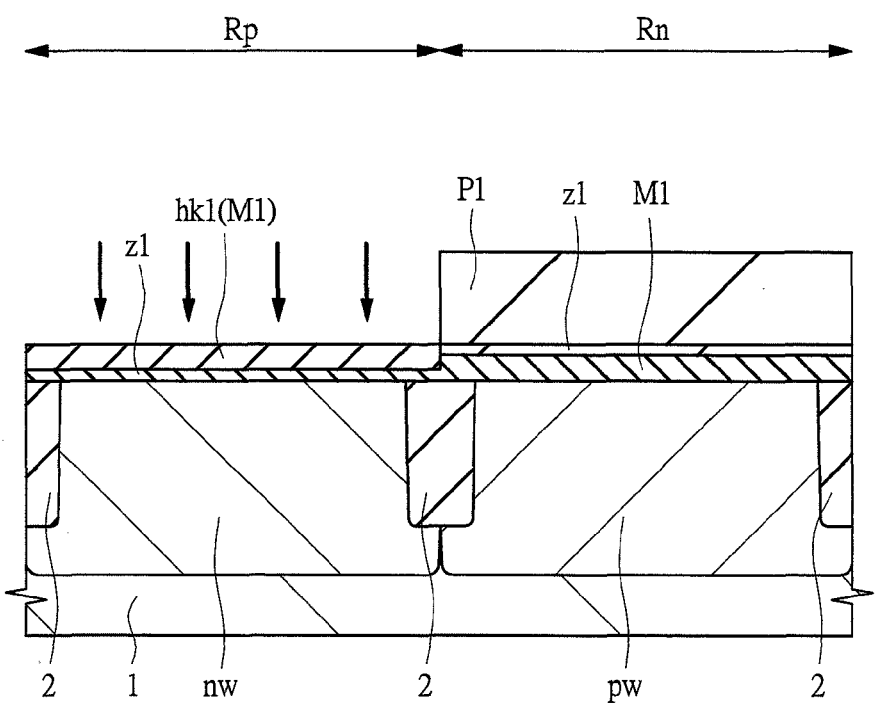
FIG. 5 is a cross-sectional view of a principal part in the manufacturing step of the semiconductor device, continued from FIG. 4.

Next, as illustrated in FIG. 5, a part of the first metal film M1 of the pMIS region Rp which is not covered with the first protective film P1 is oxidized to be converted into a first high-dielectric film hk1 from the first metal film M1. Here, since hafnium is applied to the first metal film M1, the first high-dielectric film hk1 obtained by oxidizing it becomes an insulating film mainly made of hafnium oxide. Also, since the first metal film M1 of the nMIS region Rn is covered with the first protective film P1, only the first metal film M1 of the pMIS region Rp is oxidized in a self-aligning manner to be converted into the first high-dielectric film hk1 formed of the hafnium oxide film.

Here, as a method of oxidizing the first metal film M1 of the pMIS region Rp, a plasma oxidation method is cited. The first metal film M1 formed of the hafnium film is oxidized with oxygen radicals or oxygen ions by using the plasma oxidation method to be converted into the first high-dielectric film hk1 formed of the insulating film mainly made of hafnium oxide.

Also, other method of oxidizing the first metal film M1 of the pMIS region Rp, a thermal oxidation method is cited. More particularly, the first high-dielectric film hk1 formed of the insulating film mainly made of hafnium oxide is formed by a low-temperature thermal oxidation method for oxidizing the first metal film M1 made of hafnium under a condition of 450° C. or higher and 600° C. or lower.

The first metal film M1 of the pMIS region Rp is oxidized by the above-described steps to be converted into the first high-dielectric film hk1 from the first metal film M1 of the pMIS region Rp. Note that, in the above-described explanation, it is assumed that the first metal film M1 is the hafnium film and the first high-dielectric film hk1 formed by oxidizing the film is the hafnium oxide film. On the other hand, as described above, the first metal film M1 may be the hafnium nitride film. In that case, the first high-dielectric film hk1 formed by oxidizing the film becomes a hafnium oxynitride film. Hereinafter, the first high-dielectric film hk1 will be explained as being made of hafnium oxide mainly made of hafnium and oxygen. However, even the case of using the hafnium oxynitride film mainly made of hafnium, oxygen, and nitrogen is similar, and therefore, overlapped descriptions in this explanation will be omitted.

Figure 6:
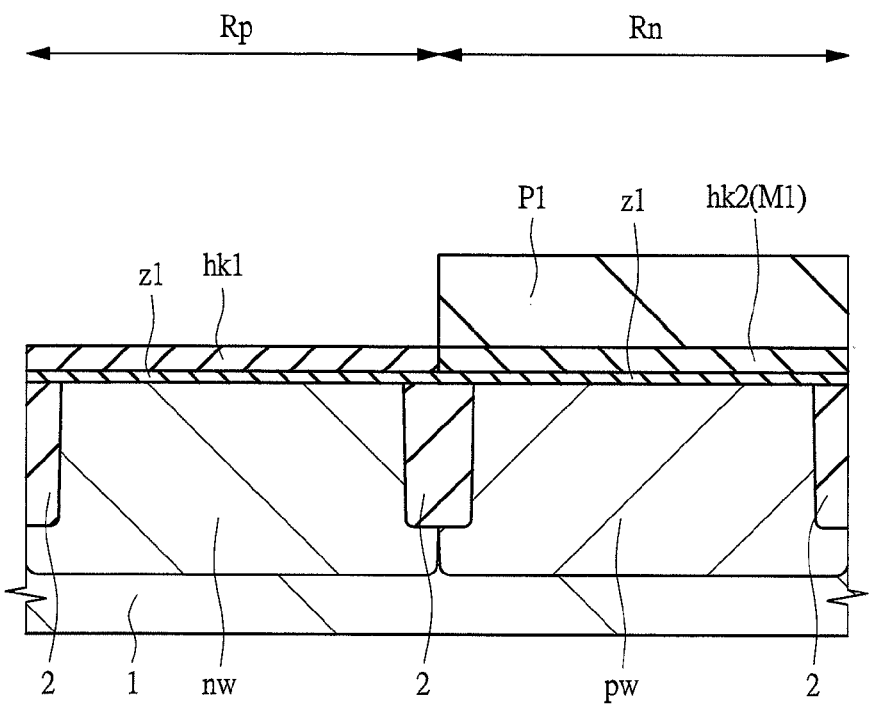
FIG. 6 is a cross-sectional view of a principal part in the manufacturing step of the semiconductor device, continued from FIG. 5.

Next, as illustrated in FIG. 6, the first metal film M1 and the first interface film z1 of the nMIS region Rn are mutually diffused by performing first thermal treatment to the silicon substrate 1 so as to be converted into a second high-dielectric film hk2 from the first metal film M1 of the nMIS region Rn. More specifically, the first metal film M1 made of hafnium and the first interface film z1 made of silicon oxide or silicon oxynitride of nMIS region Rn are mutually diffused by the first thermal treatment so as to be converted into the second high-dielectric film hk2 made of hafnium silicate mainly made of hafnium, silicon, and oxygen from the first metal film M1. For example, by a first thermal treatment under about 850° C., the above-described steps can be achieved.

Here, in the first thermal treatment, the hafnium silicate layer is formed by reacting the first interface film z1 with the metal hafnium in the nMIS region Rn, and therefore, the film thickness of the first interface film z1 is reduced. On the other hand, in the pMIS region Rp, the thickness thereof is almost the same as a film thickness of the first interface film z1 which is formed at the beginning. Therefore, in the semiconductor device formed through the present step, the film thickness of the first interface film z1 of the nMIS region Rn is thinner than the film thickness of the first interface film z1 of the pMIS region Rp.

Figure 7:
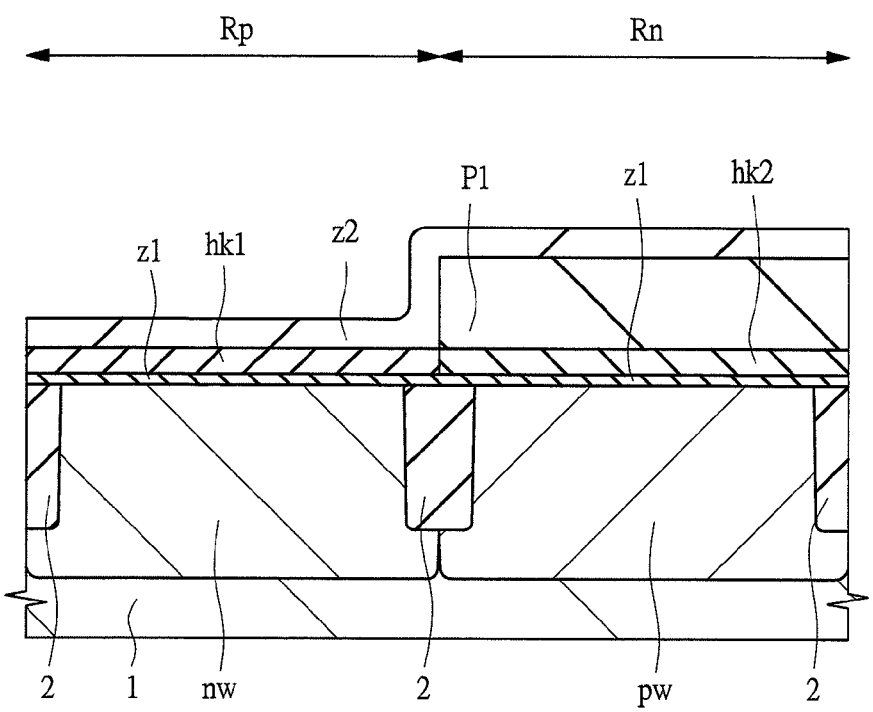
FIG. 7 is a cross-sectional view of a principal part in the manufacturing step of the semiconductor device, continued from FIG. 6.
Figure 8:
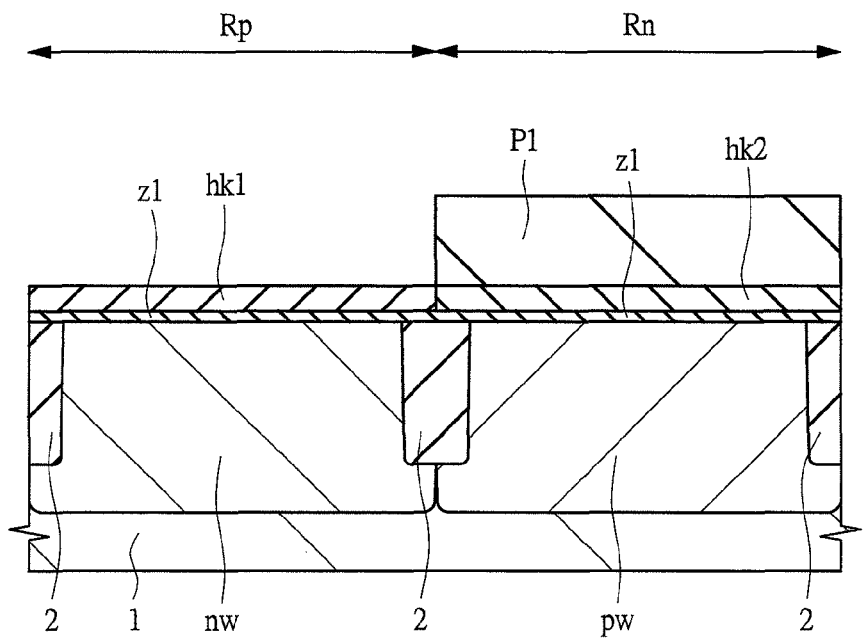
FIG. 8 is a cross-sectional view of a principal part in the manufacturing step of the semiconductor device, continued from FIG. 7.

Next, as illustrated in FIG. 7, in the pMIS region Rp, a second insulating film z2 made of first metal oxide is formed so as to be in contact with the first high-dielectric film hk1. Here, the second insulating film z2 is formed in a state without removing the first protective film P1 of the nMIS region Rn. This manner can achieve a structure that the second high-dielectric film hk2 which is covered with the first protective film P1 is not in contact with the second insulating film z2, and that a part of the first high-dielectric film hk1 of the pMIS region Rp which is not covered with the first protective film P1 is in contact with the second insulating film z2.

Here, for example, as the first metal oxide, the second insulating film z2 made of oxide of any of aluminum, titanium, and tantalum is formed. The oxide of aluminum is aluminum oxide ($AlO_x$), the oxide of titanium is titanium oxide ($TiO_x$), and the oxide of tantalum is tantalum oxide ($TaO_x$). They are formed by, for example, a PVD method, an ALD (Atomic Layer Deposition) method, or a CVD method so as to have a film thickness of about 0.5 nm.

Subsequently, second thermal treatment is performed to the silicon substrate 1. In this manner, a first metal, which is a constituent element of the first metal oxide forming the second insulating film z2, is diffused into the first high-dielectric film hk1, which is in contact with the second insulating film z2. If the first metal oxide is the aluminum oxide film, the first metal is aluminum. If the first metal oxide is the titanium oxide, the first metal is titanium. And, if the first metal oxide is the tantalum oxide, the first metal is tantalum. Therefore, in the present step, a metal of any of aluminum, titanium, and tantalum is diffused into the first high-dielectric film hk1 by the second thermal treatment. For example, the above-described structure can be obtained by thermal treatment at 1000° C. for about 1 second as the second thermal treatment. Then, by removing an excessive second insulating film z2, a structure illustrated in FIG. 8 can be obtained. By the present step, the first high-dielectric film hk1 is formed so as to be an insulating film mainly made of hafnium oxide with containing aluminum, titanium, or tantalum.

Note that, even if the step of forming the second high-dielectric film hk2 by the first thermal treatment explained above with reference to FIG. 6 is omitted, the second high-dielectric film hk2 can be formed in the nMIS region by the above-described second thermal treatment. However, in order to optimize each thermal treatment, the example of performing the thermal treatment in each of the steps is described as the manufacturing method of the present embodiment.

Then, the first protective film P1 is removed. If the first protective film P1 is formed of polycrystalline silicon, non-crystalline silicon, or silicon nitride as described above, the first protective film P1 can be removed by performing the etching with hydrofluoric acid and ammonia water. The treatment with hydrofluoric acid is for removing a naturally-oxidized film formed on a surface of the first protective film P1 in each step, and the treatment with ammonia water is for removing the first protective film P1 itself.

Figure 9:
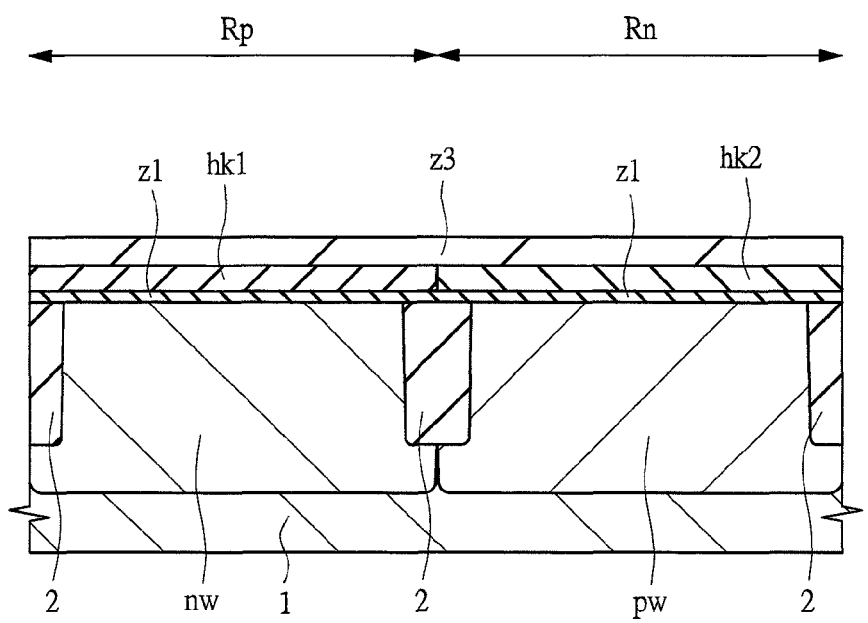
FIG. 9 is a cross-sectional view of a principal part in the manufacturing step of the semiconductor device, continued from FIG. 8.

Next, as illustrated in FIG. 9, a third insulating film z3 made of second metal oxide is formed on the silicon substrate 1. More particularly, it is intended to form the film on the silicon substrate 1 including the second high-dielectric film hk2 of the nMIS region Rn. However, in the manufacturing method of the present embodiment, the third insulating film z3 is formed on the first and second high-dielectric films hk1 and hk2 of both of the regions Rp and Rn without forming a mask on the pMIS region Rp or others.

Here, as the second metal oxide, the third insulating film z3 made of, for example, oxide of any element of the group Ia, the group IIa, and the group IIIa is formed. In the present embodiment, the third insulating film z3 made of, for example, oxide of yttrium or lanthanum of the group IIIa is formed. The oxide of yttrium is yttrium oxide ($YO_x$), and the oxide of lanthanum is lanthanum oxide ($LaO_x$). They are formed by, for example, a PVD method, an ALD method, or a CVD method so as to have a film thickness of about 1 nm.

Figure 10:
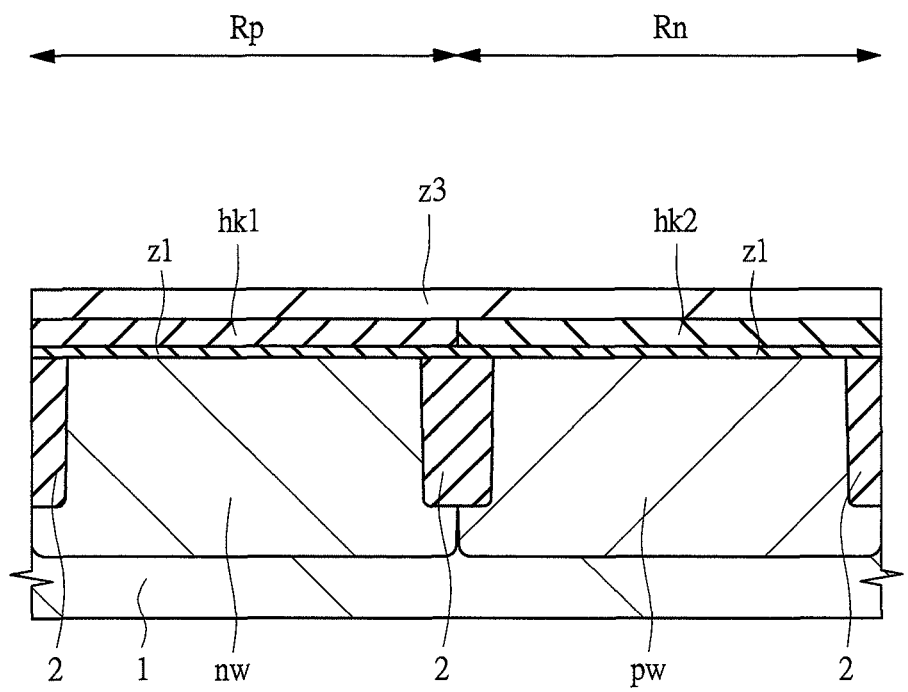
FIG. 10 is a cross-sectional view of a principal part in the manufacturing step of the semiconductor device, continued from FIG. 9.

Next, as illustrated in FIG. 10, third thermal treatment is performed to the silicon substrate 1. In this manner, a second metal, which is a constituent element of the second metal oxide forming the third insulating film z3, is diffused into the second high-dielectric film hk2, which is in contact with the third insulating film z3. If the second metal oxide is oxide of an element of any of the group Ia, the group IIa, and the group IIIa, the second metal is an element of any of the group Ia, the group IIa, and the group IIIa. More particularly, if the second metal oxide is the yttrium oxide, the second metal is yttrium. And, if the second metal oxide is the lanthanum oxide, the second metal is lanthanum. Therefore, in the present step, an element of any of the group Ia, the group IIa, and the group IIIa, such as a metal of either yttrium or lanthanum, is diffused into the second high-dielectric film hk2 by the third thermal treatment. For example, the above-described structure can be obtained by thermal treatment at 850° C. for 30 seconds as the third thermal treatment.

Here, in the third thermal treatment, desired element diffusion can be caused by treatment even at a higher temperature. However, in the manufacturing method of the present embodiment, it is preferred that the temperature of the third thermal treatment for diffusing the second metal into the second high-dielectric film hk2 is lower than the temperature of the second thermal treatment for diffusing the first metal into the first high-dielectric film hk1. A reason for this will be explained in detail below.

According to the manufacturing method of the present embodiment, the third insulating film z3 which is a diffusion source for diffusing the second metal into the second high-dielectric film hk2 is formed not only on the second high-dielectric film hk2 but also on the first high-dielectric film hk1. Therefore, if the third thermal treatment is performed in this state, the second metal is diffused also into the first high-dielectric film hk1. Here, if the second metal which is, for example, lanthanum is diffused into the first high-dielectric film hk1 made of hafnium oxide, the threshold voltage is shifted to a low-voltage side as described above. This means that, while the threshold voltage is decreased for the n-type MIS transistor, the threshold voltage is increased for the p-type MIS transistor. Therefore, it is not desired to diffuse the second metal into the first high-dielectric film hk1 serving as the gate insulating film of the p-type MIS transistor Qp if possible.

From studies by the present inventor in this point of view, it has been found out that the diffusion of the second metal such as yttrium or lanthanum is slow in the hafnium oxide forming the first high-dielectric film hk1 and that the diffusion thereof is fast in the hafnium silicate forming the second high-dielectric film hk2. And, it has been found out that the diffusion of the second metal into the first high-dielectric film hk1 can be suppressed to a problem-free level if the temperature of the second thermal treatment for diffusing the first metal into the first high-dielectric film hk1 or lower is used. That is, by using such a condition, the influence of the second metal on the threshold voltage of the p-type MIS transistor can be reduced, and the threshold voltage of the n-type MIS transistor can be varied as desired.

According to verification by the present inventor, it has been found out that, if the temperature of the third thermal treatment is set to 1050° C. which is higher than the temperature of the second thermal treatment, the threshold voltage of the p-type MIS transistor is increased by about 50 mV. This means that the second metal such as yttrium or lanthanum has been adversely diffused into not only the second high-dielectric film hk2 of the nMIS region Rn but also the first high-dielectric film hk1 of the pMIS region Rp. On the other hand, if the temperature of the third thermal treatment is set to 900° C., variation in the threshold voltage of the p-type MIS transistor is suppressed within an error range. Therefore, preferably, the temperature of the third thermal treatment is lower than the temperature of the second thermal treatment. More preferably, the temperature is set to 900° C. or lower. Note that it has been clarified by the verification by the present inventor that the temperature of the third thermal treatment is to be 800° C. or higher in order to normally diffuse the second metal such as yttrium or lanthanum into the second high-dielectric film hk2. The above description is summarized that the temperature of the third thermal treatment for diffusing the second metal into the second high-dielectric film is more preferably 800° C. or higher and 900° C. or lower. In this manner, even if the third insulating film z3 serving as the diffusion source of the second metal is in contact with the first high-dielectric film hk1 which may result in the undesirable diffusion of the second metal, the second metal is not diffused into the first high-dielectric film hk1, and can be voluntarily diffused into the desired second high-dielectric film hk2. Therefore, the patterning of the third insulating film z3 or others is not required, and therefore, the number of manufacturing steps can be reduced.

Figure 11:
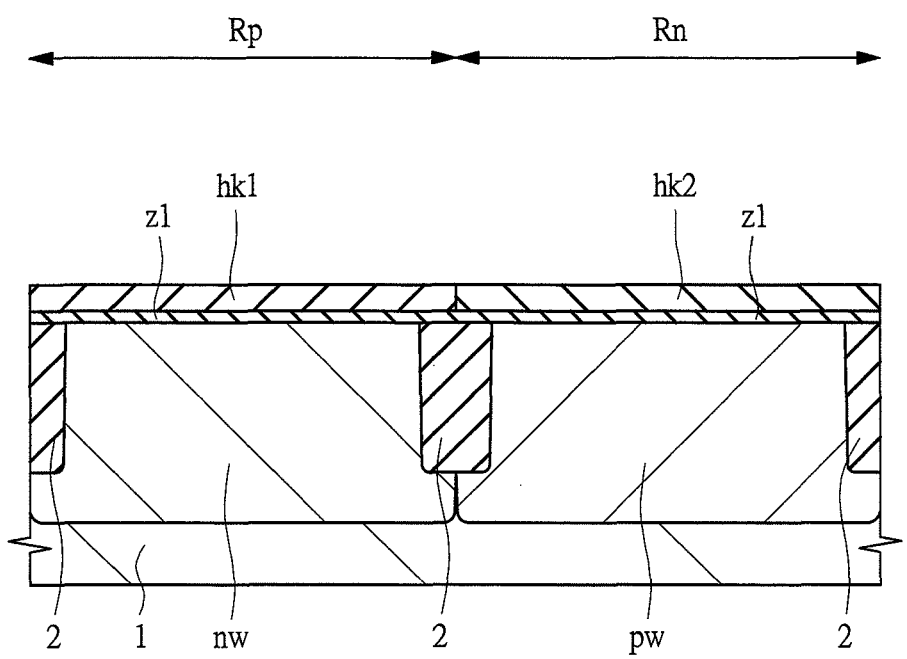
FIG. 11 is a cross-sectional view of a principal part in the manufacturing step of the semiconductor device, continued from FIG. 10.

Also, as described above, in the manufacturing method of the present embodiment, the diffusion of the second metal into the first high-dielectric film hk1 cannot be completely suppressed. Accordingly, in the manufacturing method of the present embodiment, the second metal such as yttrium or lanthanum remaining in the pMIS region Rp is removed after the above-described step, so that a structure illustrated in FIG. 11 is obtained. This manner can remove the second metal such as yttrium or lanthanum in the first high-dielectric film hk1, which can increase the threshold voltage of the p-type MIS transistor Qp. As a result, the threshold voltage of the p-type MIS transistor Qp can be decreased easier.

For example, as the method of removing the second metal remaining in the pMIS region Rp, etching by hydrochloric acid or nitric acid is effective. This manner can remove the second metal such as yttrium or lanthanum in the first high-dielectric film hk1, and the above-described effects can be obtained. Further, if the etching by hydrochloric acid or nitric acid is performed, the above-described desired treatments can be performed without damaging the first high-dielectric film hk1 formed of the hafnium oxide film and the second high-dielectric film hk2 formed of the hafnium silicate film which have been formed until the previous step ends. Since the first high-dielectric film hk1 and the second high-dielectric film hk2 are members serving as the gate insulating films of the semiconductor device including the MIS transistors with the structure of the metal gate electrode/high-dielectric gate insulating film of the present embodiment, the step which can be performed without damaging them is effective.

Figure 12:
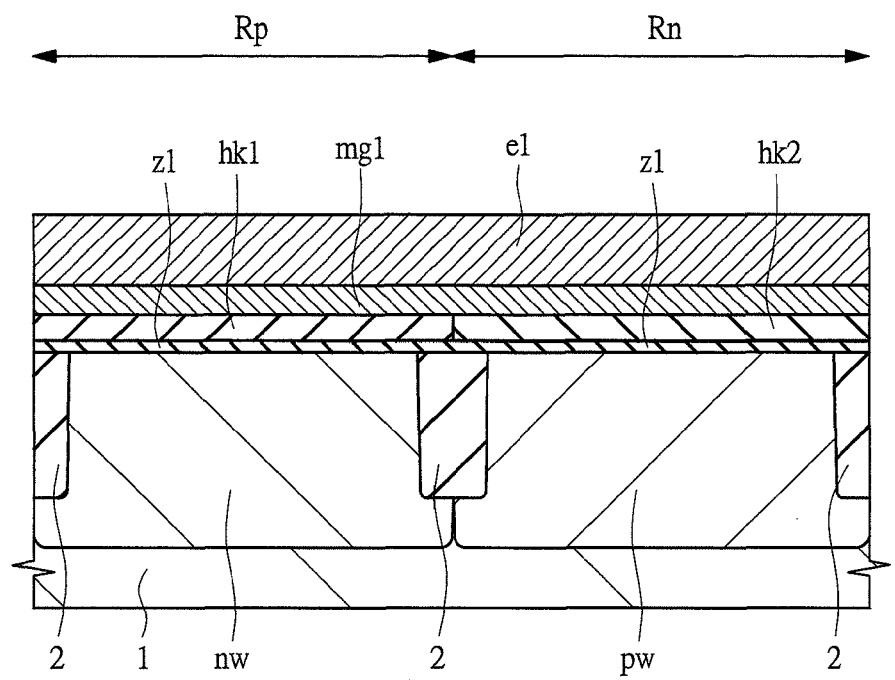
FIG. 12 is a cross-sectional view of a principal part in the manufacturing step of the semiconductor device, continued from FIG. 11.

Next, as illustrated in FIG. 12, a metal gate film (second metal film) mg1 and a first conductive film e1 are sequentially formed so as to cover the first high-dielectric film hk1 and the second high-dielectric film hk2. For example, as the metal gate film mg1, a metal film mainly made of titanium nitride (TiN) having a thickness of about 10 nm is formed by a PVD method or a CVD method. Also, for example, as the first conductive film e1, a conductive film mainly made of polycrystalline silicon having a thickness of about 50 nm is formed by a PVD method or a CVD method.

Figure 13:
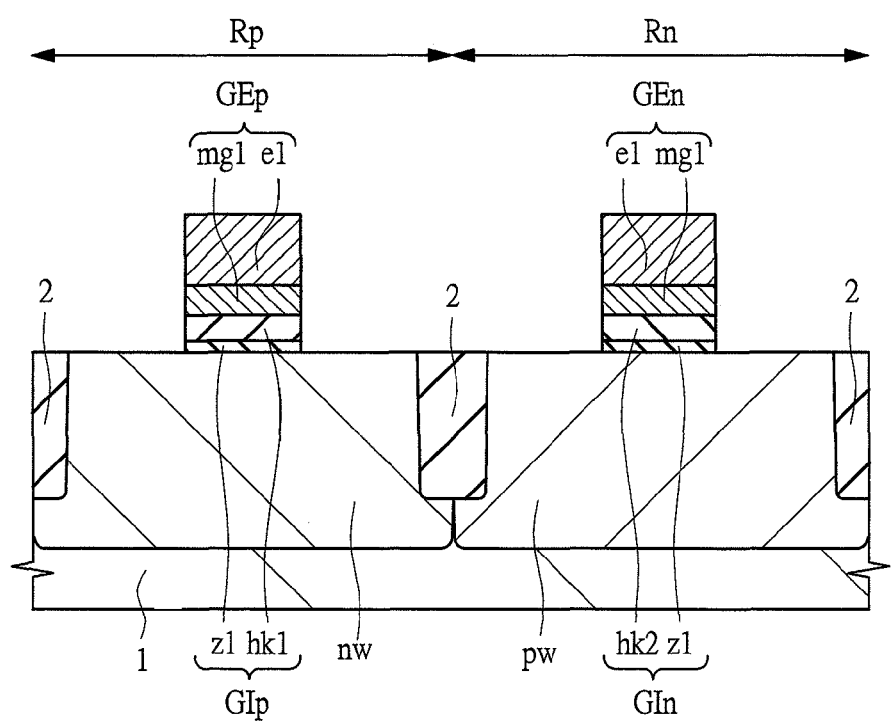
FIG. 13 is a cross-sectional view of a principal part in the manufacturing step of the semiconductor device, continued from FIG. 12.

Next, as illustrated in FIG. 13, the stacked film on the silicon substrate 1 is processed by, for example, a photolithography method and a dry etching method, so that the pMIS gate electrode GEp and the pMIS gate insulating film GIp are formed in the pMIS region Rp, and the nMIS gate electrode GEn and the nMIS gate insulating film Gin are formed in the nMIS region Rn. More specifically, in the pMIS region Rp, the first conductive film e1, the metal gate film mg1, the first high-dielectric film hk1, and the first interface film z1 are processed, so that the pMIS gate electrode GEp formed of the metal gate film mg1 and the first conductive film e1 and the pMIS gate insulating film GIp formed of the first interface film z1 and the first high-dielectric film hk1 are formed. Also, in the nMIS region Rn, the first conductive film e1, the metal gate film mg1, the second high-dielectric film hk2, and the first interface film z1 are processed, so that the nMIS gate electrode GEn formed of the metal gate film mg1 and the first conductive film e1 and the nMIS gate insulating film Gin formed of the first interface film z1 and the second high-dielectric film hk2 are formed.

In the above-described manner, the MIS structure of the metal gate electrode/high-dielectric gate insulating film to be included in the semiconductor device of the present embodiment can be formed.

Figure 14:
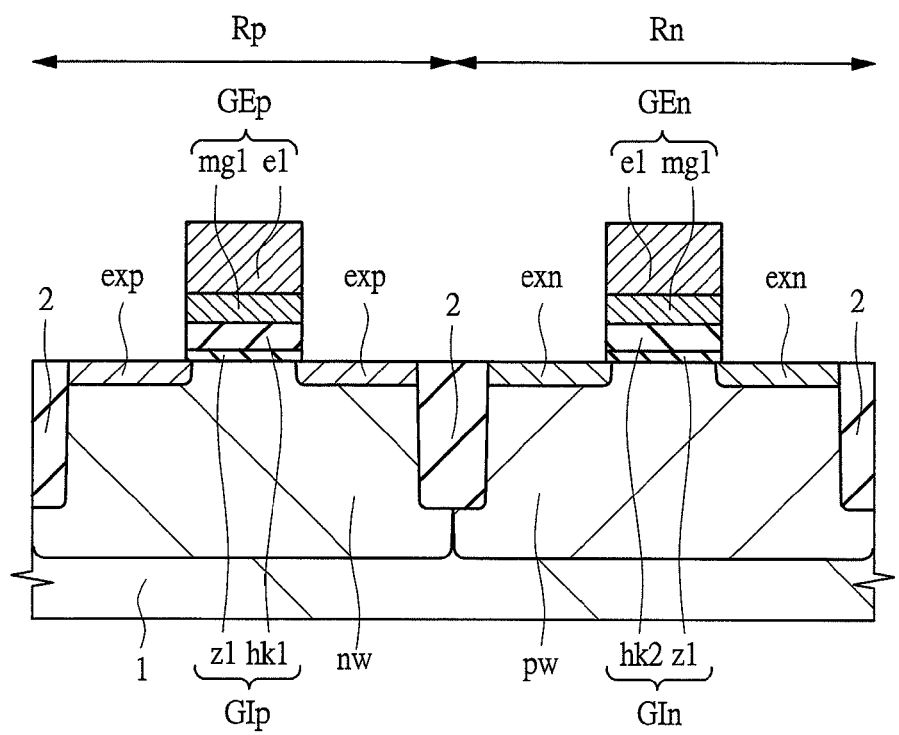
FIG. 14 is a cross-sectional view of a principal part in the manufacturing step of the semiconductor device, continued from FIG. 13.

Next, as illustrated in FIG. 14, extension regions exp and exn are formed in a surface of the silicon substrate 1 on a lateral bottom portion of the respective gate electrodes GEp and GEn by, for example, a photolithography method and an ion implantation method. More specifically, the pMIS extension region exp which is a p-type semiconductor region is formed in the corresponding portion in the n-well nw of the pMIS region Rp, and the nMIS extension region exn which is an n-type semiconductor region is formed in the corresponding portion in the p-well pw of the nMIS region Rn.

Figure 15:
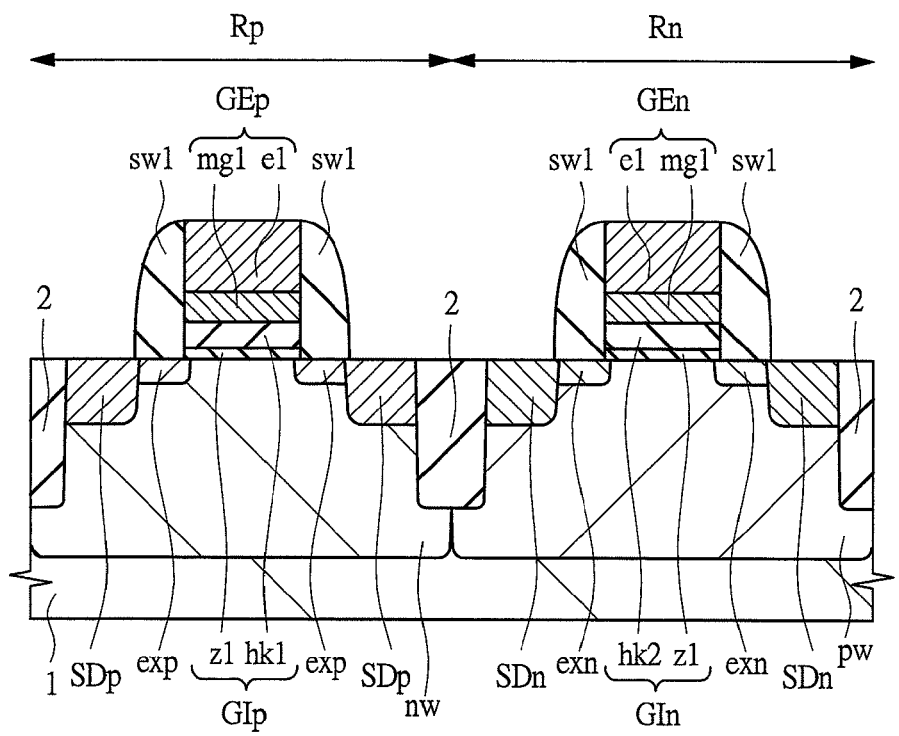
FIG. 15 is a cross-sectional view of a principal part in the manufacturing step of the semiconductor device, continued from FIG. 14.

Next, as illustrated in FIG. 15, a sidewall spacer sw1 formed of, for example, an insulating film mainly made of silicon oxide is formed so as to cover sidewalls of the respective gate electrodes GEp and GEn. This can be formed by forming a silicon oxide film on the silicon substrate 1 and performing etching back.

Then, source/drain regions SDp and SDn are formed in a surface of the silicon substrate 1 on a lateral bottom portion of the sidewall spacer sw1 by a photolithography method and an ion implantation method or others. More specifically, the pMIS source/drain region SDp which is a p-type semiconductor region is formed in the corresponding portion in the n-well nw of the pMIS region Rp, and the nMIS source/drain region SDn which is an n-type semiconductor region is formed in the corresponding portion in the p-well pw of the nMIS region Rn.

Figure 16:
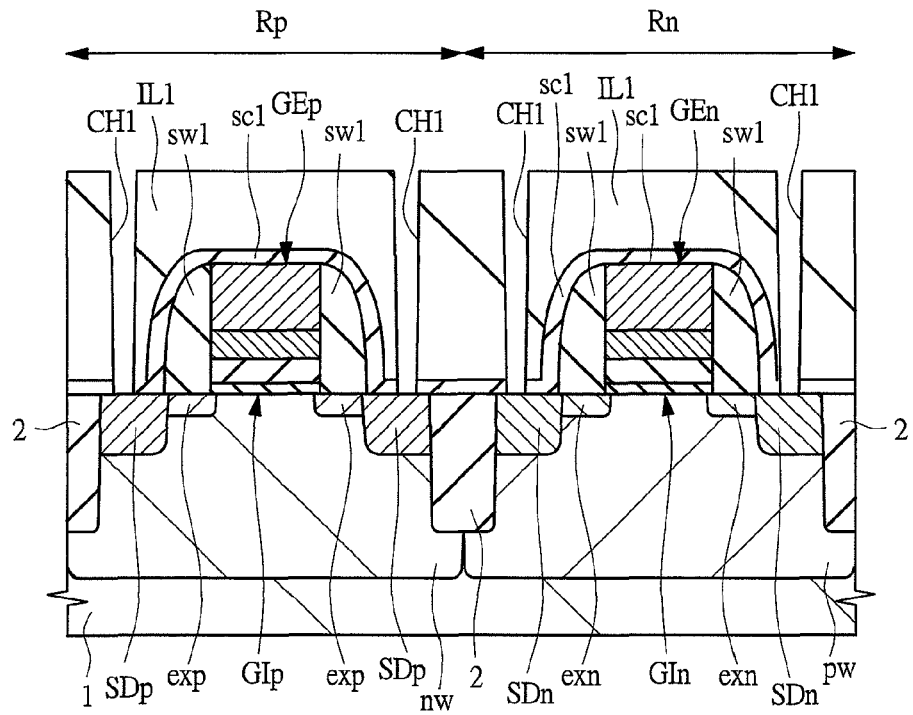
FIG. 16 is a cross-sectional view of a principal part in the manufacturing step of the semiconductor device, continued from FIG. 15.

Next, as illustrated in FIG. 16, an etching stop film sc1 formed of, for example, an insulating film mainly made of silicon nitride and an interlayer insulating film IL1 formed of, for example, an insulating film mainly made of silicon oxide are formed so as to cover a structure which has been formed until the above-described step ends.

Then, a contact hole CH1 is formed by a photolithography method and a dry etching method so as to penetrate through the interlayer insulating film IL1 and the etching stop film sc1 and reach the source/drain regions SDp and SDn and the gate electrodes GEp and GEn, respectively. At this time, by using the etching stop film sc1, whose material is different from that of the interlayer insulating film IL, as an etching stop layer, over etching to the source/drain region, the gate electrode, or others of the base can be prevented.

Figure 17:
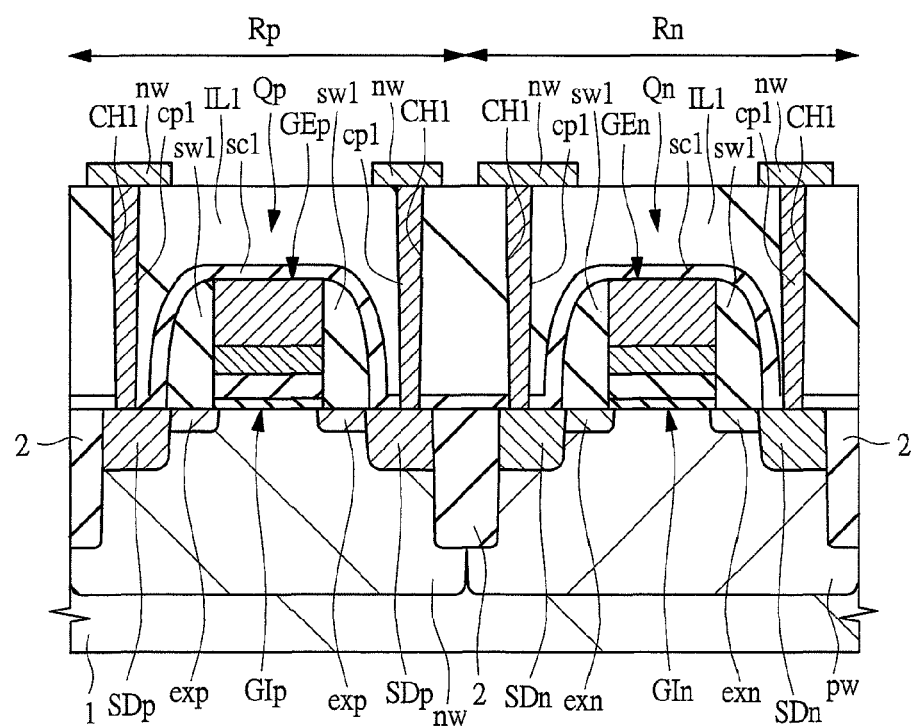
FIG. 17 is a cross-sectional view of a principal part in the manufacturing step of the semiconductor device, continued from FIG. 16.

Next, as illustrated in FIG. 17, by burying a conductive film mainly made of, for example, tungsten into the contact hole CH1, a contact plug cp1 is formed. Here, a tungsten film is deposited by a PVD method or others, and then, is subjected to an etching method or a CMP method, so that the tungsten film outside the contact hole CH1 is removed.

Then, a metal wiring mw1 is formed on the interlayer insulating film IL so as to be electrically connected to the contact plug cp1. In this manner, the metal wiring mw1 can be formed by, for example, depositing aluminum or copper and processing that so as to provide a desired wiring pattern by a photolithography method and an etching method or others. In a subsequent step, a multilayer wiring having a desired conductive path is formed by repeating the contact plug forming step and the metal wiring forming step as described above.

As described above, in the present embodiment, the effective MIS transistors as explained with reference to FIG. 1 can be formed.

In the manufacturing method of the present embodiment, an effective structure can be obtained as eliminating the patterning step which results in the shape processing by utilizing the difference between the hafnium oxide film and the hafnium silicate film in the easiness of the diffusion of the metal element into the film. This can be said as a step capable of easily achieving further miniaturization in addition to reduction in the number of steps.

Further, the separate formation of the hafnium oxide film in the pMIS region and the hafnium silicate film in the nMIS region can be also achieved by making full use of the oxidation step and the thermal treatment step without using a patterning step which results in the shape processing of the film itself. Also in this point of view, this can be said as a step capable of easily achieving further miniaturization in addition to reduction in the number of steps.

And, the MIS transistors included in the semiconductor device of the present embodiment has the structure capable of achieving further decrease in the threshold voltage of the transistors of both polarities which are the p-type MIS transistor and the n-type MIS transistor. According to the above description, by applying the semiconductor device of the present embodiment, high performance of the semiconductor device including the MIS transistors with the structure of the metal gate electrode/high-dielectric gate insulating film can be achieved.

In the foregoing, the invention made by the present inventor has been concretely described based on the embodiments. However, it is needless to say that the present invention is not limited to the foregoing embodiments and various modifications and alterations can be made within the scope of the present invention.

Industrial Applicability

The present invention can be applied to a semiconductor device including MIS transistors with a structure of a metal gate electrode/high-dielectric gate insulating film.

Symbol Explanation
   1 silicon substrate (semiconductor substrate)
   2 isolation portion
   Bna nMIS main gate insulating film
   Bpa pMIS main gate insulating film
   C1a hafnium oxide film
   C2a aluminum oxide film
   C3a lanthanum oxide film
   C4a titanium nitride film
   CH1 contact hole
   cp1 contact plug
   e1 first conductive film (conductive film)
   exn nMIS extension region
   exp pMIS extension region
   GEn nMIS gate electrode (first gate electrode)
   GEp pMIS gate electrode (second gate electrode)
   GIn nMIS gate insulating film (first gate insulating film)
   GIp pMIS gate insulating film (second gate insulating film)
   hk1 first high-dielectric film
   hk2 second high-dielectric film
   IL1 interlayer insulating film
   M1 first metal film
   mg1 metal gate film (conductive film, second metal film)
   mw1 metal wiring
   nw n-well
   P1 first protective film
   pw p-well
   Qn n-type MIS transistor (n-channel-type field-effect transistor)
   Qp p-type MIS transistor (p-channel-type field-effect transistor)
   Rn nMIS region (second region)
   Rp pMIS region (first region)
   sc1 etching stop film
   SDn nMIS source/drain region
   SDp pMIS source/drain region
   Tna nMIS cap insulating film
   Tpa pMIS cap insulating film
   z1 first interface film (first insulating film)
   z2 second insulating film
   z3 third insulating film

The invention claimed is:

1. A semiconductor device comprising: a p-channel-type field-effect transistor in a first region of a semiconductor substrate; and an n-channel-type field-effect transistor in a second region of the semiconductor substrate, wherein
the p-channel-type field-effect transistor includes a first gate electrode formed on the semiconductor substrate so as to interpose a first gate insulating film formed thereon,
the first gate insulating film includes a first insulating film and a first high-dielectric film sequentially formed on the semiconductor substrate,
the first high-dielectric film is formed of an insulating film mainly made of hafnium and oxygen with containing aluminum, titanium, or tantalum,
the n-channel-type field-effect transistor includes a second gate electrode formed on the semiconductor substrate so as to interpose a second gate insulating film formed thereon,
the second gate insulating film includes the first insulating film and a second high-dielectric film sequentially formed on the semiconductor substrate, and
the second high-dielectric film is formed of an insulating film mainly made of hafnium, silicon, and oxygen with containing an element of any of group Ia, group IIa, and group IIIa.

2. The semiconductor device according to claim 1, wherein the second high-dielectric film is formed of an insulating film mainly made of the hafnium, the silicon, and the oxygen with containing yttrium or lanthanum.

3. The semiconductor device according to claim 1, wherein each of the first gate electrode and the second gate electrode is formed of a stacked film of a conductive film mainly made of titanium nitride and a conductive film mainly made of polycrystalline silicon in sequence from a lower layer.

4. The semiconductor device according to claim 1, wherein the first insulating film is formed of an insulating film mainly made of silicon oxide or silicon oxynitride.

5. The semiconductor device according to claim 1, wherein a film thickness of the first insulating film of the n-channel-type field-effect transistor is thinner than a film thickness of the first insulating film of the p-channel-type field-effect transistor.

6. The semiconductor device according to claim 1, wherein the p-channel-type field-effect transistor and the n-channel-type field-effect transistor have a dual metal gate structure in which the transistors are arranged close to each other so as to interpose an element isolation portion therebetween.

7. The semiconductor device according to claim 1, wherein
the first high-dielectric film is formed of an insulating film mainly made of the hafnium, the oxygen, and nitrogen, and
the second high-dielectric film is formed of an insulating film mainly made of the hafnium, the silicon, the oxygen, and nitrogen.

8. A method of manufacturing a semiconductor device comprising
a step of forming a p-channel-type field-effect transistor in a first region of a semiconductor substrate and forming an n-channel-type field-effect transistor in a second region of the semiconductor substrate, wherein
the step of forming the p-channel-type field-effect transistor and the n-channel-type field-effect transistor includes steps of:
(a) forming a first insulating film on the semiconductor substrate;
(b) forming a first metal film on the first insulating film;
(c) oxidizing the first metal film of the first region to be converted into a first high-dielectric film from the first metal film of the first region;
(d) mutually diffusing the first metal film and the first insulating film of the second region by first thermal treatment to be converted into a second high-dielectric film;
(e) diffusing a first metal into the first high-dielectric film by forming a second insulating film made of first metal oxide so as to be in contact with the first high-dielectric film in the first region and performing second thermal treatment thereto;
(f) diffusing a second metal into the second high-dielectric film by forming a third insulating film made of second metal oxide on the second high-dielectric film and performing third thermal treatment thereto; and
(g) processing the first high-dielectric film and the first insulating film in the first region to form a first gate insulating film formed of the first insulating film and the first high-dielectric film, and processing the second high-dielectric film and the first insulating film in the second region to form a second gate insulating film formed of the first insulating film and the second high-dielectric film,
in the step of (a), the first insulating film mainly made of silicon oxide or silicon oxynitride is formed,
in the step of (b), the first metal film mainly made of hafnium is formed,
in the step of (c), the first metal film of the first region is oxidized to be converted into the first high-dielectric film mainly made of hafnium and oxygen, and,
in the step of (d), the first metal film and the first insulating film of the second region are mutually diffused to be converted into the second high-dielectric film mainly made of hafnium, silicon, and oxygen.

9. The method of manufacturing the semiconductor device according to claim 8, wherein,
in the step of (f), the second metal is diffused into the second high-dielectric film by integrally forming the third insulating film on the semiconductor substrate including the second high-dielectric film and performing the third thermal treatment in a state that the third insulating film is in contact with at least the first high-dielectric film and the second high-dielectric film.

10. The method of manufacturing the semiconductor device according to claim 8, wherein,
in the step of (c), the first metal film is oxidized by plasma oxidation to be converted into the first high-dielectric film from the first metal film.

11. The method of manufacturing the semiconductor device according to claim 8, wherein,
in the step of (c), the first metal film is oxidized by thermal oxidation at 450° C. or higher and 600° C. or lower to be converted into the first high-dielectric film from the first metal film.

12. The method of manufacturing the semiconductor device according to claim 8, wherein,
in the step of (e), by forming the second insulating film made of oxide of any of aluminum, titanium, and tantalum as the first metal oxide and performing the second thermal treatment thereto, any metal of the aluminum, the titanium, and the tantalum is diffused into the first high-dielectric film as the first metal.

13. The method of manufacturing the semiconductor device according to claim 8, wherein,
in the step of (f), by forming the third insulating film made of oxide of any element of group Ia, group IIa, and group IIIa as the second metal oxide and performing the third thermal treatment thereto, any element of the group Ia, the group IIa, and the group IIIa is diffused into the second high-dielectric film as the second metal.

14. The method of manufacturing the semiconductor device according to claim 13, wherein,
in the step of (f), by forming the third insulating film made of oxide of yttrium or lanthanum as the second metal oxide and performing the third thermal treatment thereto, either element of the yttrium or the lanthanum is diffused into the second high-dielectric film as the second metal.

15. The method of manufacturing the semiconductor device according to claim 14, further comprising a step of,
after the step of (f) and before the step of (g),
(h) removing the second metal remaining in the first region.

16. The method of manufacturing the semiconductor device according to claim 15, wherein,
in the step of (h), the second metal remaining in the first region is removed by performing etching by hydrochloric acid or nitric acid.

17. The method of manufacturing the semiconductor device according to claim 8, wherein
a temperature of the third thermal treatment in the step of (f) is lower than a temperature of the second thermal treatment in the step of (e).

18. The method of manufacturing the semiconductor device according to claim 17, wherein
the temperature of the third thermal treatment is at 800° C. or higher and 900° C. or lower.

19. The method of manufacturing the semiconductor device according to claim 8, further comprising a step of,
after the step of (f) and before the step of (g),
(i) sequentially forming a second metal film and a first conductive film so as to cover the first high-dielectric film and the second high-dielectric film, wherein,
in the step of (g),
in the first region,
the first conductive film, the second metal film, the first high-dielectric film, and the first insulating film are processed to simultaneously form a first gate electrode and the first gate insulating film, the first gate electrode being formed of the second metal film and the first conductive film, and the first gate insulating film being formed of the first insulating film and the first high-dielectric film, and, in the second region, the first conductive film, the second metal film, the second high-dielectric film, and the first insulating film are processed to simultaneously form a second gate electrode and the second gate insulating film, the second gate electrode being formed of the second metal film and the first conductive film, and the second gate insulating film being formed of the first insulating film and the second high-dielectric film.

20. The method of manufacturing the semiconductor device according to claim 8, further comprising a step of, after the step of (b) and before the step of (c),
   (j) forming a first protective film so as to cover the first metal film of the second region, wherein,
   in the step of (c), a part of the first metal film of the first region which is not covered with the first protective film is oxidized to be converted into the first high-dielectric film.

21. The method of manufacturing the semiconductor device according to claim 20, further comprising a step of, after the step of (e) and before the step of (f),
   (k) removing the first protective film, wherein,
   in the step of (j), the first protective film made of polycrystalline silicon, non-crystalline silicon, or silicon nitride is formed, and,
   in the step of (k), the first protective film is removed by performing etching by hydrofluoric acid and ammonia water.

22. The method of manufacturing the semiconductor device according to claim 8, further comprising a step of, after the step of (b) and before the step of (c),
   (j) forming a first protective film so as to cover the first metal film of the second region, wherein,
   in the step of (e), the second insulating film is integrally formed on the semiconductor substrate to form the second insulating film so as to be in contact with a part of the first high-dielectric film of the first region which is not covered with the first protective film.

23. The method of manufacturing the semiconductor device according to claim 22, further comprising a step of, after the step of (e) and before the step of (f),
   (k) removing the first protective film, wherein,
   in the step of (j), the first protective film made of polycrystalline silicon, non-crystalline silicon, or silicon nitride is formed, and,
   in the step of (k), the first protective film is removed by performing etching by hydrofluoric acid and ammonia water.

24. The method of manufacturing the semiconductor device according to claim 8, wherein,
   in the step of (b), the first metal film mainly made of the hafnium and nitrogen is formed,
   in the step of (c), the first metal film of the first region is oxidized to be converted into the first high-dielectric film mainly made of the hafnium, the oxygen, and nitrogen, and,
   in the step of (d), the first metal film and the first insulating film of the second region are mutually diffused to be converted into the second high-dielectric film mainly made of the hafnium, the silicon, the oxygen, and nitrogen.

* * * * *